United States Patent
Kim et al.

(10) Patent No.: US 9,763,341 B2
(45) Date of Patent: Sep. 12, 2017

(54) DISPLAY DEVICE AND METHOD OF MANUFACTURING THE SAME

(71) Applicant: SAMSUNG DISPLAY CO., LTD., Gyeonggi-do (KR)

(72) Inventors: Youngnam Kim, Gyeonggi-do (KR); Jaesuk Song, Gyeonggi-do (KR); Hyunho Jeong, Busan (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/988,978

(22) Filed: Jan. 6, 2016

(65) Prior Publication Data

US 2016/0316576 A1    Oct. 27, 2016

(30) Foreign Application Priority Data

Apr. 22, 2015 (KR) .................. 10-2015-0056716

(51) Int. Cl.
| H05K 7/02 | (2006.01) |
| H05K 7/04 | (2006.01) |
| H05K 5/00 | (2006.01) |
| B29C 45/14 | (2006.01) |
| B29C 37/00 | (2006.01) |
| G02F 1/1333 | (2006.01) |
| G02F 1/1335 | (2006.01) |

(Continued)

(52) U.S. Cl.
CPC ....... H05K 5/0017 (2013.01); B29C 37/0085 (2013.01); B29C 45/14311 (2013.01); G02F 1/1336 (2013.01); G02F 1/133308 (2013.01); H05K 3/0017 (2013.01); H05K 5/0217 (2013.01); *G02F 2001/133314* (2013.01); *G02F 2001/133317* (2013.01); *G02F 2001/133325* (2013.01); *G02F 2201/46* (2013.01)

(58) Field of Classification Search
CPC .. H05K 5/0017; H05K 3/0017; H05K 5/0217; B29C 37/0085; B29C 45/14311; G02F 1/1336; G02F 1/133308
USPC .................. 361/728–730, 807, 809, 810
See application file for complete search history.

(56) References Cited

U.S. PATENT DOCUMENTS 4,739,453 A * 4/1988 Kurokawa ........... H05K 9/0039
                                                          174/250
5,150,511 A * 9/1992 Sakata ................. G11B 5/1272
                                                          29/603.2

(Continued)

FOREIGN PATENT DOCUMENTS

FR      2175673 A1    10/1973
JP   2010002745 A     1/2010
(Continued)

OTHER PUBLICATIONS

The extention European search report for application No. 16160822.9 dated Jul. 28, 2016.

*Primary Examiner* — Hung S Bui
(74) *Attorney, Agent, or Firm* — Cantor Colburn LLP

(57) ABSTRACT

A display device includes: a display panel that displays an image; a first frame that supports a lower edge of the display panel; and a second frame that supports the first frame, where the second frame has a plurality of grooves formed in a bonding portion of the second frame contacting the first frame, a portion of the first frame is disposed in the grooves of the second frame, and the grooves have a width in a range of about 1 micrometer (μm) to about 30 μm.

9 Claims, 8 Drawing Sheets

(51) Int. Cl.
*H05K 3/00* (2006.01)
*H05K 5/02* (2006.01)

(56) References Cited

U.S. PATENT DOCUMENTS

| | | | |
|---|---|---|---|
| 7,433,196 B1* | 10/2008 | Wang | H05K 5/026 |
| | | | 361/752 |
| 7,663,870 B2* | 2/2010 | Choi | H04N 5/64 |
| | | | 349/58 |
| 2002/0104331 A1* | 8/2002 | Fukuyama | C03B 11/08 |
| | | | 65/61 |
| 2004/0114372 A1* | 6/2004 | Han | G02F 1/133604 |
| | | | 362/330 |
| 2009/0262554 A1* | 10/2009 | Lee | G02F 1/133308 |
| | | | 362/633 |
| 2012/0052248 A1 | 3/2012 | Horng | |
| 2012/0162880 A1 | 6/2012 | Yoon et al. | |
| 2013/0342785 A1* | 12/2013 | Tsai | G02F 1/133308 |
| | | | 349/58 |
| 2014/0152940 A1* | 6/2014 | Wang | G02B 6/0011 |
| | | | 349/62 |
| 2014/0176867 A1 | 6/2014 | Huang | |

FOREIGN PATENT DOCUMENTS

| | | |
|---|---|---|
| KR | 1020110071556 A | 6/2011 |
| KR | 1020110133119 | 12/2011 |
| KR | 1020110133457 A | 12/2011 |
| KR | 1020120132848 A | 12/2012 |
| KR | 1020130037378 A | 4/2013 |
| KR | 101380916 B1 | 4/2014 |

* cited by examiner

DISPLAY DEVICE AND METHOD OF MANUFACTURING THE SAME

This application claims the priority to Korean Patent Application No. 10-2015-0056716, filed on Apr. 22, 2015, and all the benefits accruing therefrom under 35 U.S.C. §119, the content of which in its entirety is herein incorporated by reference.

BACKGROUND

1. Field

Embodiments of the invention relate to a display device and a method of manufacturing the display device, and more particularly, to a display device having a thin bezel and a method of manufacturing the display device.

2. Description of the Related Art

Display devices are classified into types including liquid crystal display ("LCD") devices, organic light emitting diode ("OLED") display devices, plasma display panel ("PDP") devices, electrophoretic display ("EPD") devices, and the like, based on a light emitting scheme thereof.

Such a display device may include a display panel for displaying an image, various optical components for enhancing an optical property of the display panel, and a frame for accommodating the display panel and the various optical components.

A frame of the display device typically includes a first frame that supports a lower edge of a display panel and provides a space for accommodating various optical components therein, and a second frame that supports the first frame and various components therein.

The first frame may be fixed to the second frame through a hook coupling scheme or using a double-sided tape, or the like, or may be integrally formed with the second frame as a single unitary and indivisible unit through an injection molding process.

SUMMARY

In a display device, where the first frame with the second frame are integrally formed through the injection molding process, a burring or hemming shape may be formed in the second frame in advance and then the first frame may be formed, to increase a bonding strength therebetween. However, due to a space occupied by the burring or hemming shape formed in the second frame, a width of a bezel of the display device may increase.

Embodiments of the invention are directed to a display device having a narrow bezel with enhanced bonding strength between a first frame and a second frame thereof, and method of manufacturing the display device.

According to an exemplary embodiment of the invention, a display device includes: a display panel which displays an image; a first frame which supports a lower edge of the display panel; and a second frame which supports the first frame, where the second frame has a plurality of grooves formed in a bonding portion of the second frame contacting the first frame, at least a portion of the first frame is disposed in the grooves of the second frame, and the grooves have a width in a range of about 1 micrometer ($\mu$m) to about 30 $\mu$m.

In an exemplary embodiment, the second frame may include a bottom portion contacting the first frame.

In an exemplary embodiment, the second frame may further include a side wall portion extending from an edge of the bottom portion in a vertical direction.

In an exemplary embodiment, the first frame may contact the bottom portion and the side wall portion.

In an exemplary embodiment, the first frame and the second frame may have a bonding strength of about 100 kilogram-forces per square centimeter ($kgf/cm^2$) or more therebetween.

In an exemplary embodiment, the first frame may include at least one material selected from an epoxy resin composition; a silicon resin composition; a modified epoxy resin composition such as a silicon-modified epoxy resin; a modified silicon resin composition such as an epoxy-modified silicon resin; a polyimid resin composition; a modified polyimide resin composition; polyphthalamide ("PPA"); a polycarbonate ("PC") resin; polyphenylene sulfide ("PPS"); a liquid crystal polymer ("LCP"); an acrylonitrile butadiene styrene ("ABS") resin; a phenol resin; an acrylic resin; and a polybutylene terephthalate ("PBT") resin.

In an exemplary embodiment, the second frame may include at least one of the following materials: stainless steel, aluminum (Al), an Al alloy, magnesium (Mg), a Mg alloy, copper (Cu), a Cu alloy, and an electrolytic galvanized iron ("EGI").

In an exemplary embodiment, the second frame may have a predetermined curvature in a direction.

In an exemplary embodiment, the second frame may have a radius of curvature in a range of about 1000 millimeters (mm) to about 5000 mm.

According to another exemplary embodiment of the invention, a method of manufacturing a display device, the method includes: forming a second frame by processing a metal; forming a plurality of grooves having a eidth in a range of about 1 $\mu$m to about 30 $\mu$m in a bonding portion of the second frame; and forming a first frame on the bonding portion and in the plurality of grooves formed in the bonding portion.

In an exemplary embodiment, the forming the plurality of grooves in the bonding portion may include: forming a protection layer on an entire surface of the second frame except the bonding portion; and etching the bonding portion using at least one material selected from: a hydrochloric acid compound, a sulfuric acid compound, and a nitric acid compound.

In an exemplary embodiment, the etching the bonding portion may include performing a dipping process.

In an exemplary embodiment, t dipping process may be peformed at a temperature in a range of about 30 degrees Celsius (° C.) to about 70° C., and during a period of time in a range of about 1 minute to about 5 minutes.

In an exemplary embodiment, the forming the first frame may include performing an injection molding process.

In an exemplary embodiment, the forming the first frame may further include using one of an insert injection molding process and an outsert injection molding process.

In an exemplary embodiment, the first frame may include at least one material selected from: an epoxy resin composition; a silicon resin composition; a modified epoxy resin composition such as a silicon-modified epoxy resin; a modified silicon resin composition such as an epoxy-modified silicon resin; a polyimid resin composition; a modified polyimide resin composition; PPA; a PC; PPS; an LCP; an ABS resin; a phenol resin; an acrylic resin; and a PBTresin.

In an exemplary embodiment, the second frame may have a predetermined curvature in a direction.

In an exemplary embodiment, the second frame may have a radius of curvature in a range of about 1000 mm to about 5000 mm.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the disclosure of invention will be more clearly understood from the following detailed description taken in conjunction with the accompanying drawings, in which.

DETAILED DESCRIPTION

Figure 1:
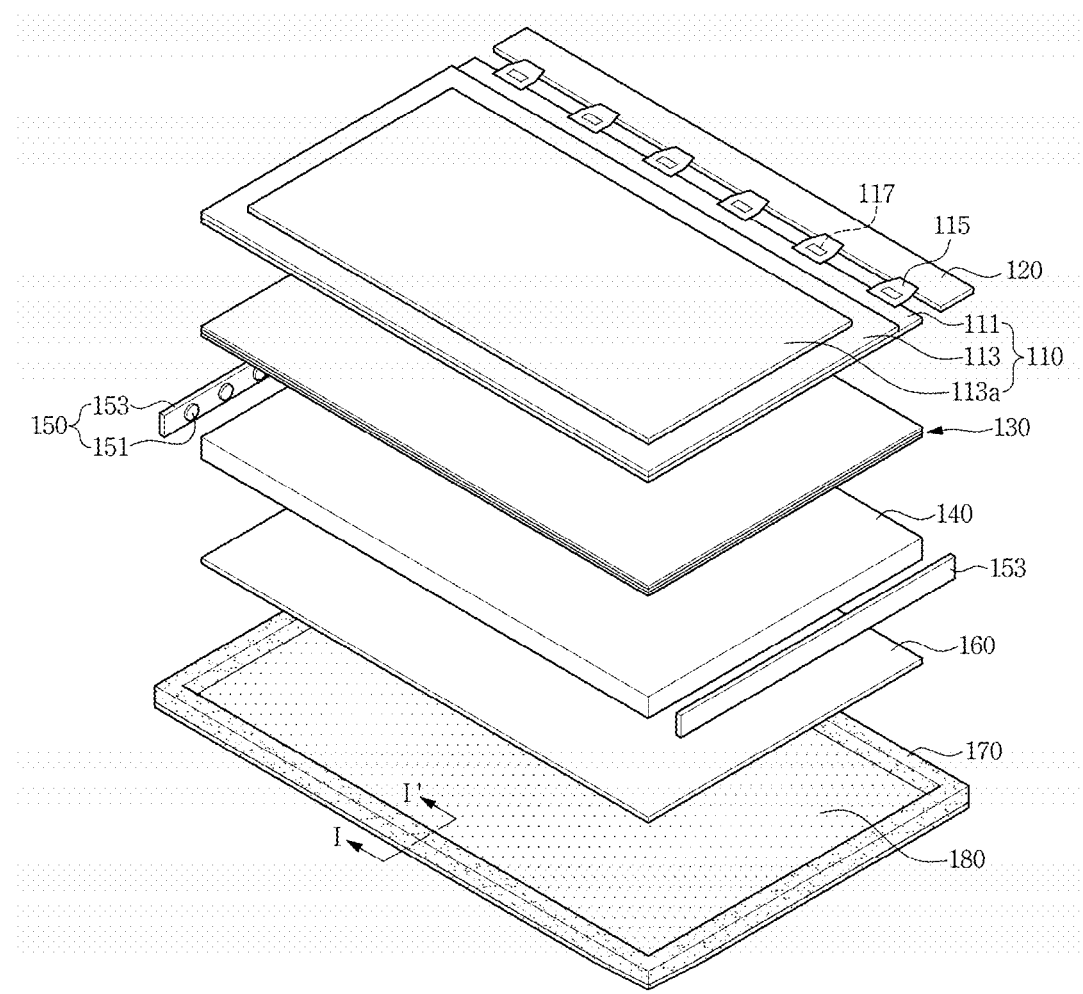
FIG. 1 is an exploded perspective view illustrating a display device according to an exemplary embodiment.

Exemplary embodiments will now be described more fully hereinafter with reference to the accompanying drawings.

However, they may be embodied in different forms and should not be construed as limited to the exemplary embodiments set forth herein. Rather, these exemplary embodiments are provided so that this disclosure will be thorough and complete, and will fully convey exemplary implementations to those skilled in the art.

The terminology used herein is for the purpose of describing particular embodiments only and is not intended to be limiting. Throughout the specification, when an element is referred to as being "connected" to another element, the element is "directly connected" to the other element, or "electrically connected" to the other element with one or more intervening elements interposed therebetween. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When it is determined that a detailed description may make the purpose of the invention unnecessarily ambiguous in the description of the invention, such a detailed description will be omitted. In addition, the same components and corresponding components are given the same reference numeral.

Hereinafter, for convenience of description, exemplary embodiments of a display device, where the display device is a liquid crystal display ("LCD") device, will be described in detail. However, the display device is not limited thereto, and features of the invention may also be applied to other types of display device, such as an organic light emitting diode ("OLED") display device or a plasma display panel ("PDP") device, for example.

Hereinafter, for convenience of description, exemplary embodiments of the display device, where the display device includes an edge-type backlight unit, will described, but the invention is not limited thereto. According to other embodiments, the display device may include a direct-type backlight unit or a corner-type backlight unit.

Figure 2:
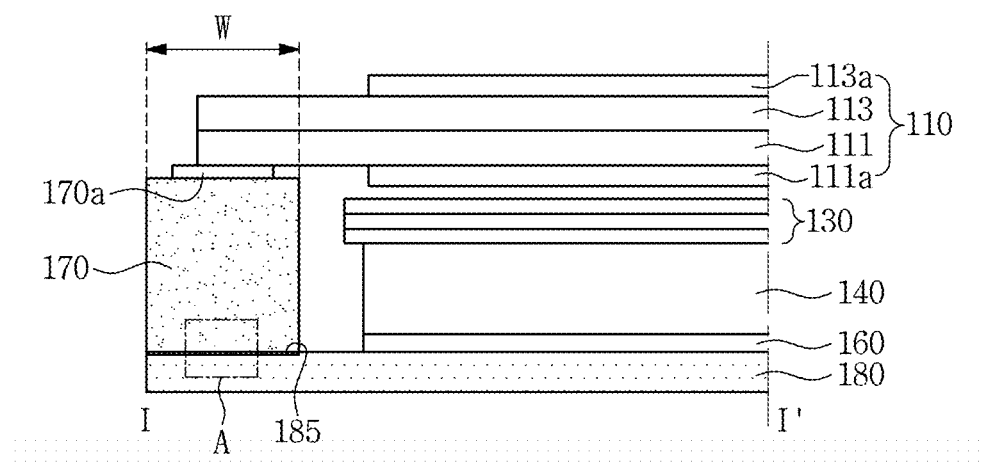
FIG. 2 is a cross-sectional view taken along line I-I' of FIG. 1.

FIG. 1 is an exploded perspective view illustrating a display device according to an exemplary embodiment; and FIG. 2 is a cross-sectional view taken along line I-I' of FIG. 1.

Referring to FIGS. 1 and 2, an exemplary embodiment of the display device may include a display panel 110, a driving circuit board 120, an optical sheet 130, a light guide plate 140, a light source unit 150, a reflective sheet 160, a first frame 170, and a second frame 180. Hereinafter, the optical sheet 130, the light guide plate 140, the light source unit 150, the reflective sheet 160, the first frame 170, and the second frame 180 will be collectively referred to as a backlight unit.

The display panel 110 may have a quadrangular planar shape and display an image by externally receiving an electric signal applied thereto. The display panel 110 may include a first substrate 111, a second substrate 113 opposing the first substrate 111, and a liquid crystal layer (not illustrated) disposed between the first and second substrates 111 and 113.

The first substrate 111 may include a plurality of pixel electrodes disposed substantially in a matrix form, a thin film transistor that applies a driving voltage to each of the pixel electrodes, and various signal lines for driving the pixel electrode and the thin film transistor.

The second substrate 113 may be disposed to oppose the first substrate 111, and may include a common electrode including a transparent conductive material, and a color filter. In one exemplary embodiment, for example, the color filter may include red, green and blue filters.

The liquid crystal layer (not illustrated) may be interposed between the first and second substrates 111 and 113, and liquid crystal molecules therein may be rearranged by an electric field formed between the pixel electrode and the common electrode. The rearranged liquid crystal molecules in the liquid crystal layer may adjust a level of transmittance of light emitted from the backlight unit, the light having the adjusted level of transmittance may pass through the color filter, and an image may be displayed outwardly.

The display device may further include a lower polarizing plate 111a and an upper polarizing plate 113a, which are disposed on a lower surface of the first substrate 111 and an upper surface of the second substrate 113, respectively. The upper polarizing plate 113a and the lower polarizing plate 111a may each have an area corresponding to an area (e.g., a display area) of the display panel 110.

The upper polarizing plate 113a may pass through a predetermined component of polarized light from among externally supplied light, and may absorb or block the remainder of the externally supplied light. The lower polarizing plate 111a may pass through a predetermined component of polarized light from among the light emitted from the backlight unit, and may absorb or block the remainder of the light emitted from the backlight unit.

The driving circuit board 120 may be disposed at a side of the display panel 110. The driving circuit board 120 may provide various control signals and power signals for driving the display panel 110.

The display panel 110 and the driving circuit board 120 may be electrically connected to one another by a flexible printed circuit board ("FPCB") 115. The FPCB 115 may be a chip-on-film ("COF") or a tape-carrier-package ("TCP"), and the number of the FPCBs 115 in the display device may vary based on, for example, a size and a driving scheme, of the display panel 110.

A driving chip 117 may be disposed, e.g., mounted, on the FPCB 115. The driving chip 117 may generate various driving signals for driving the display panel 110. The driving chip 117 may be a single chip in which a timing controller and a data driving circuit are integrated with one another, and may also be referred to as, for example, a driver integrated circuit ("IC"), or a source IC.

The optical sheet 130 may be disposed on the light guide plate 140, and may diffuse or collect light transmitted from the light guide plate 140. The optical sheet 130 may include a diffusion sheet, a prism sheet, and a protective sheet. The diffusion sheet, the prism sheet, and the protective sheet may be sequentially disposed or stacked on the light guide plate 140.

The prism sheet may collect light guided by the light guide plate 140, the diffusion sheet may disperse light collected by the prism sheet, and the protective sheet may protect the prism sheet. Light passed through the protective sheet may be supplied to the display panel 110.

The light guide plate 140 may uniformly supply light from the light source unit 150 to the display panel 110. The light guide plate 140 may have a quadrangular planar shape. According to embodiments, a light source may include a light emitting diode ("LED") chip, and in such an embodiment, the light guide plate 140 may have various shapes including, for example, a predetermined groove or a protrusion, based on a position of the light source.

In an exemplary embodiment, as described above, the light guide plate 140 has a planar shape, that is, a plate, but not being limited thereto. According to embodiments, the light guide plate 140 may have a sheet or film shape to achieve slimness of the display device. The light guide plate 140 is to be understood as having a concept that includes not only a plate but also a film for guiding light.

The light guide plate 140 may include or be formed of a light-transmissive material, for example, an acrylic resin such as poly(methyl methacrylate) ("PMMA") or polycarbonate ("PC") to improve efficiency of guided light.

The light source unit 150 may include a light source 151 and a light source substrate 153 on which the light source 151 is disposed.

In an exemplary embodiment, the light source 151 may be disposed on an edge or a light-incident side surface of the light guide plate 140. In such an embodiment, the light source 151 may emit light toward the edge or light-incident side surface of the light guide plate 140. The light source 151 may include at least one LED chip (not illustrated) and a package (not illustrated) for accommodating the LED chip therein. In one exemplary embodiment, for example, the LED chip may be a gallium nitride (GaN)-based LED chip that emits blue light.

The number of the light sources 151 may vary based on, for example, a size and luminance uniformity, of the display panel 110. The light source substrate 153 may be a printed circuit board ("PCB") or a metal printed circuit board ("MPCB").

According to embodiments, the light source unit 150 may be disposed on an edge of the light guide plate 140. In such an embodiment, the light source unit 150 may be disposed on one, two, or four side surfaces of the light guide plate 140 based on, for example, a size and luminance uniformity, of the display panel 110.

Although not illustrated in FIGS. 1 and 2, a wavelength converting unit may be interposed between the light guide plate 140 and the light source unit 150. The wavelength converting unit may include a material that converts a wavelength of light. In one exemplary embodiment, for example, the wavelength converting unit may convert a wavelength of blue light emitted from a blue LED light source to obtain white light therefrom.

The reflective sheet 160 may include or be formed of, for example, polyethylene terephthalate ("PET") to have reflectivity. One surface of the reflective sheet 160 may be coated with a diffusion layer including, for example, titanium dioxide ($TiO_2$). The reflective sheet 160 may include a metal, such as silver (Ag), for example, or be formed of a material including the.

The first frame 170 may support a lower edge of the display panel 110, and may provide a space for accommodating the optical sheet 130, the light guide plate 140, the light source unit 150, the reflective sheet 160, and the like, therein.

The first frame 170 may have a polygonal loop shape having an opening therein. In one exemplary embodiment, for example, the first frame 170 may have a quadrangular loop shape having an opening therein. The first frame 170 may be provided as a single unit or as a unit divided into a plurality parts or portions thereof.

In an exemplary embodiment, the first frame 170 may include at least one material selected from: an epoxy resin composition; a silicon resin composition; a modified epoxy resin composition such as a silicon-modified epoxy resin; a modified silicon resin composition such as an epoxy-modified silicon resin; a polyimid resin composition; a modified polyimide resin composition; polyphthalamide ("PPA"); a PCresin; polyphenylene sulfide ("PPS"); a liquid crystal polymer ("LCP"); an acrylonitrile butadiene styrene ("ABS") resin; a phenol resin; an acrylic resin; and a polybutylene terephthalate (PBT) resin.

In an exemplary embodiment, the first frame 170 may be integrally formed with the second frame 180 as a single unitary and indivisible unit, which is to be described later in greater detail, through an injection molding process.

The first frame 170 may have a width W in a range of about 0.5 millimeters (mm) to about 1.0 mm. An exemplary embodiment of the display device, where the first frame 170 has the width W of about 1.0 mm or less, may have a narrow bezel.

An adhesive member 170a may be interposed between the display panel 110 and the first frame 170. In one exemplary embodiment, for exampole, the adhesive member 170a may be a double-sided tape.

The second frame 180 may maintain a framework of the display device, and may protect various components accommodated in a space defined by the first and the second frames 170 and 180. The second frame 180 may support the first frame 170 and the various components. The second frame 180 may have a structure in which an additional side wall portion of the second frame 180 extending therefrom in a vertical direction is omitted. In such an embodiment, the display device, where the second frame 180 has no side wall portion, may have a narrow bezel.

The second frame 180 may include or be formed of a metal material having rigidity and high heat dissipation properties. In one exemplary emboidment, for example, the second frame 180 may include at least one material selected from =: stainless steel, aluminum (Al), an Al alloy, magnesium (Mg), a Mg alloy, copper (Cu), a Cu alloy, and an electrolytic galvanized iron ("EGI").

The second frame 180 may have a bonding portion 185 contacting the first frame 170. The bonding portion 185 may be an upper edge of the second frame 180, corresponding to a position on which the first frame 170 is disposed, and the bonding portion 185 may have a width W substantially the same as that of the first frame 170.

The second frame 180 may have a plurality of grooves (not illustrated) defined in the bonding portion 185. The bonding portion 185 will hereinafter be described in greater detail with reference to FIGS. 3 and 4.

Figure 3:
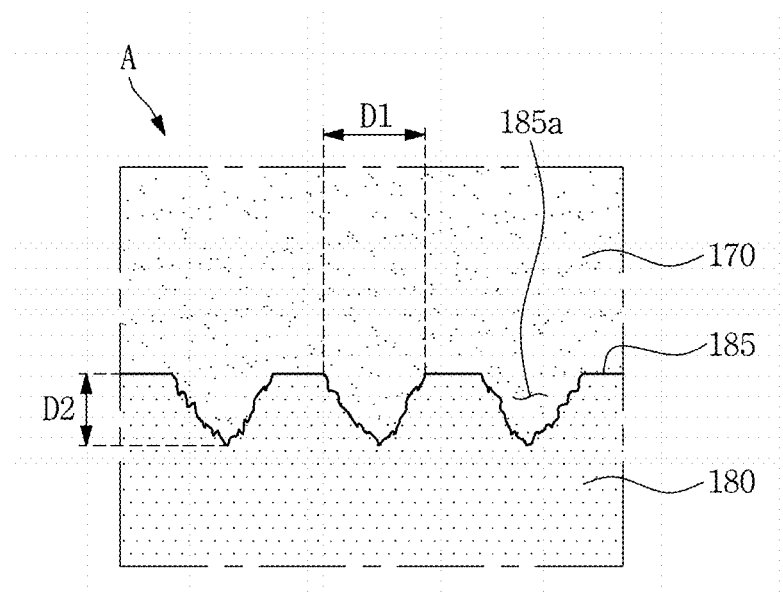
FIG. 3 is an enlarged view illustrating portion "A" of FIG. 2.
Figure 4:
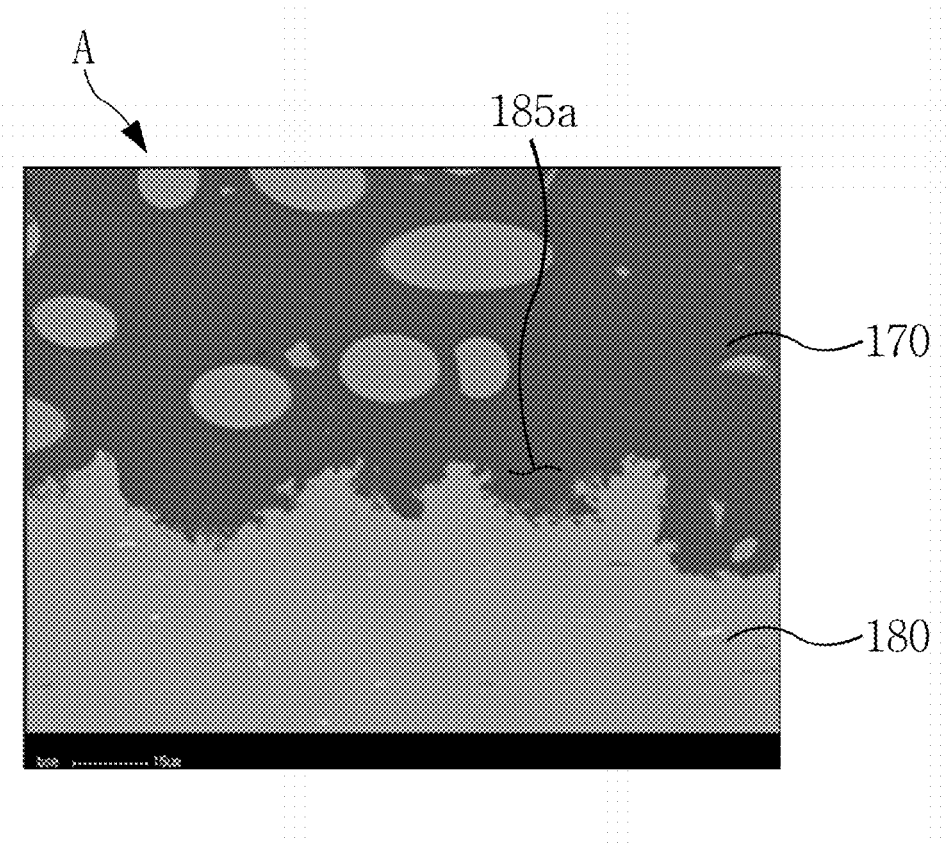
FIG. 4 is an enlarged picture image of portion "A" of FIG. 2 observed by an electron microscope.

FIG. 3 is an enlarged view illustrating portion "A" of FIG. 2; and FIG. 4 is an enlarged picture image of portion "A" of FIG. 2 observed by an electron microscope.

Referring to FIGS. 3 and 4, the second frame 180 may have a plurality of grooves 185a defined in the bonding portion 185. The plurality of grooves 185a may have an average width D1 in a range of about 1 micrometer (μm) to about 30 μm, and may have an average depth D2 in a range of about 1 μm to about 10 μm.

The grooves 185a may have an irregular shape, for example, a crack-like shape. The plurality of grooves 185a may be defined in the bonding portion 185 in an irregular manner.

The first frame 170 may be disposed on the bonding portion 185 of the second frame 180 and in the grooves 185a of the second frame 180.

The first frame 170 may be integrally formed with the second frame 180 as a single unitary and indivisible unit through an injection molding process, and during the injection molding process, one or more portions of the first frame 170 may be inserted into the plurality of grooves 185a of the second frame 180.

The first frame 170 and the second frame 180 may have a bonding strength of about 100 kilogram-forces per square centimeter ($kgf/cm^2$) or more therebetween. In such an embodiment of the display device, the first frame 170 may be injected into the plurality of grooves 185a defined on the second frame 180, to be adhesively inserted into the plurality of grooves 185a to be relatively firmly fixed thereto.

In such an embodiment of the display device, the first frame 170 is disposed in the second frame 180 having the plurality of grooves 185a, through an injection molding process, thereby enhancing the bonding strength between the first frame 170 and the second frame 180 and effectively providing a display device having a narrow bezel.

Figure 5A:
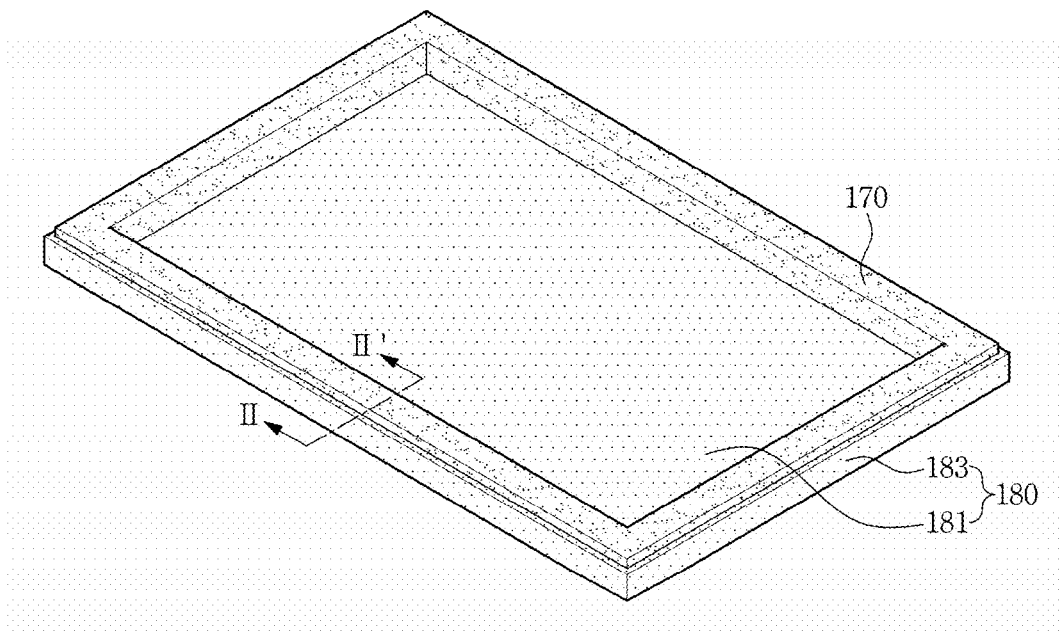
FIG. 5A is a top perspective view illustrating a frame of a display device according to an alternative exemplary embodiment.
Figure 5B:
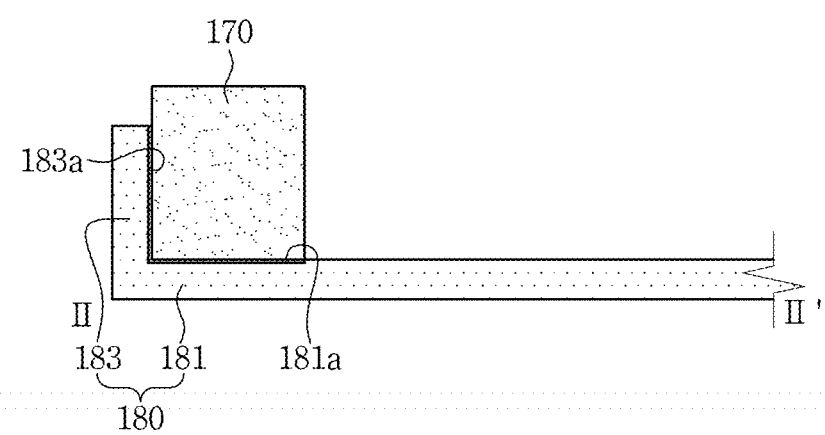
FIG. 5B is a cross-sectional view taken along line II-IF of FIG. 5A.

FIG. 5A is a top perspective view illustrating a frame of a display device according to an alternative exemplary embodiment; and FIG. 5B is a cross-sectional view taken along line II-IF of FIG. 5A.

Referring to FIGS. 5A and 5B, an alternative exemplary embodiment of a display device may include a first frame 170 that supports a lower edge of a display panel (not illustrated) and defines a space for accommodating various optical components therein, and a second frame 180 that supports the first frame 170 and various components therein.

In such an embodiment, the second frame 180 may include a bottom portion 181, and a side wall portion 183 extending from an edge of the bottom portion 181 in a vertical direction. The bottom portion 181 and the side wall portion 183 may define bonding portions 181a and 183a that contact the first frame 170, respectively.

The second frame 180 may have a plurality of grooves (not illustrated) defined in the bonding portions 181a and 183a. The plurality of grooves may have an average width in a range of about 1 μm to about 30 μm, and may have an average depth in a range of about 1 μm to about 10 μm. The grooves may have an irregular shape, for example, a crack-like shape. The plurality of grooves may be defined in the bonding portions 181a and 183a in an irregular manner.

The first frame 170 may be disposed on the bonding portions 181a and 183a of the second frame 180 and in the grooves of the second frame 180. The first frame 170 may be integrally formed with the second frame 180 as a single unitary and indivisible unit through an injection molding process, and during the injection molding process, one or more portions of the first frame 170 may be inserted into the plurality of grooves of the second frame 180.

In an exemplary embodiment of the display device, as shown in FIGS. 5A and 5B, the first frame 170 is coupled to the bottom portion 181 and the side wall portion 183 of the second frame 180, such that the first frame 170 and the second frame 180 may be relatively firmly fixed to one another.

Other features of the frame shown in FIGS. 5A and 5B are substantially the same as those of the frame described above with reference to FIGS. 1 to 4, and any repetitive detailed description thereof will be omitted.

Figure 6A:
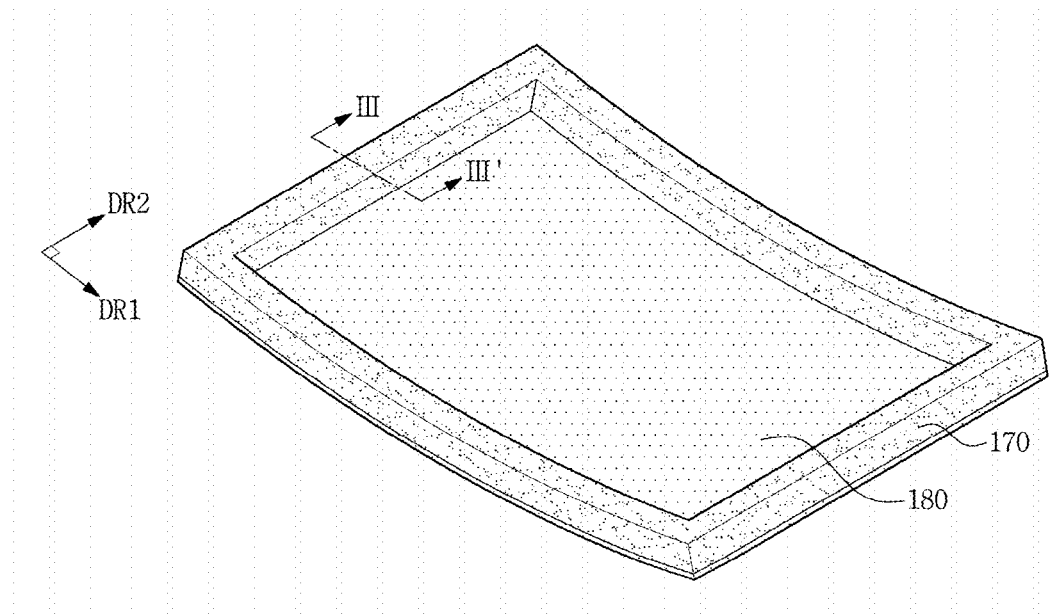
FIG. 6A is a top perspective view illustrating a frame of a display device according to another alternative exemplary embodiment.
Figure 6B:
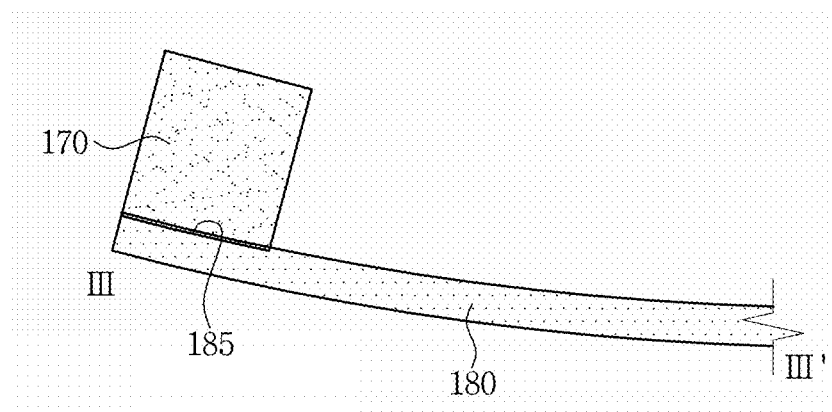
FIG. 6B is a cross-sectional view taken along line of FIG. 6A.

FIG. 6A is a top perspective view illustrating a frame of a display device according to another alternative exemplary embodiment; and FIG. 6B is a cross-sectional view taken along line of FIG. 6A.

Hereinafter, an exemplary embodiment of the display device, where the display device is a landscape-type display device having a greater first length in a first direction DR1 than a second length and curved in a second direction DR2 perpendicular to the first direction as shown in FIGS. 6A and 6B, will be described in detail, but the type of the display device is not limited thereto. Hereinafter, a direction of a long side of the display device will be referred to as the first direction DR1 and a direction of a short side of the display device will be referred to as the second direction DR2, for ease of description.

Referring to FIGS. 6A and 6B, an exemplary embodiment of the display device may include a first frame 170 that supports a lower edge of a display panel (not illustrated) and defines a space for accommodating various optical components therein, and a second frame 180 that supports the first frame 170 and various components therein.

The first frame 170 and the second frame 180 may be manufactured to have a predetermined curvature based on the first direction DR1. The first frame 170 and the second frame 180 may have a radius of curvature in a range of about 1000 mm to about 5000 mm. The second frame 180 may have a structure in which an additional side wall portion of the second frame 180 extending therefrom in a vertical direction is omitted, e.g., a plate-like shape.

The second frame 180 may have a bonding portion 185 around an edge thereof contacting the first frame 170. The second frame 180 may have a plurality of grooves (not illustrated) formed in the bonding portion 185. The plurality of grooves may have an average major axis in a range of about 1 μm to about 30 μm, and may have an average depth in a range of about 1 μm to about 10 μm. The grooves may have an irregular shape, for example, a crack-like shape. The plurality of grooves may be formed in the bonding portion 185 in an irregular manner.

The first frame 170 may be disposed on the bonding portion 185 of the second frame 180 and in the grooves of the second frame 180. The first frame 170 may be integrally formed with the second frame 180 as a single unitary and indivisible unit through an injection molding process, and during the injection molding process, one or more portions of the first frame 170 may be inserted into the plurality of grooves of the second frame 180.

In the display device according to the third exemplary embodiment, the second frame 180 may have a structure in which an additional side wall portion of the second frame 180 extending therefrom in a vertical direction is omitted, such that a display device having a narrow bezel and a flexible display device may be provided rather conveniently. Further, the display device according to the third exemplary embodiment may be enhanced in a bonding strength between the first frame 170 and the second frame 180.

Other features of the frame shown in FIGS. 6A and 6B are substantially the same as those of the frame described above with reference to FIGS. 1 to 4, and any repetitive detailed description thereof will be omitted.

FIGS. 7A through 7D are cross-sectional views illustrating a method of manufacturing the display device according to an exemplary embodiment, respectively.

Figure 7A:
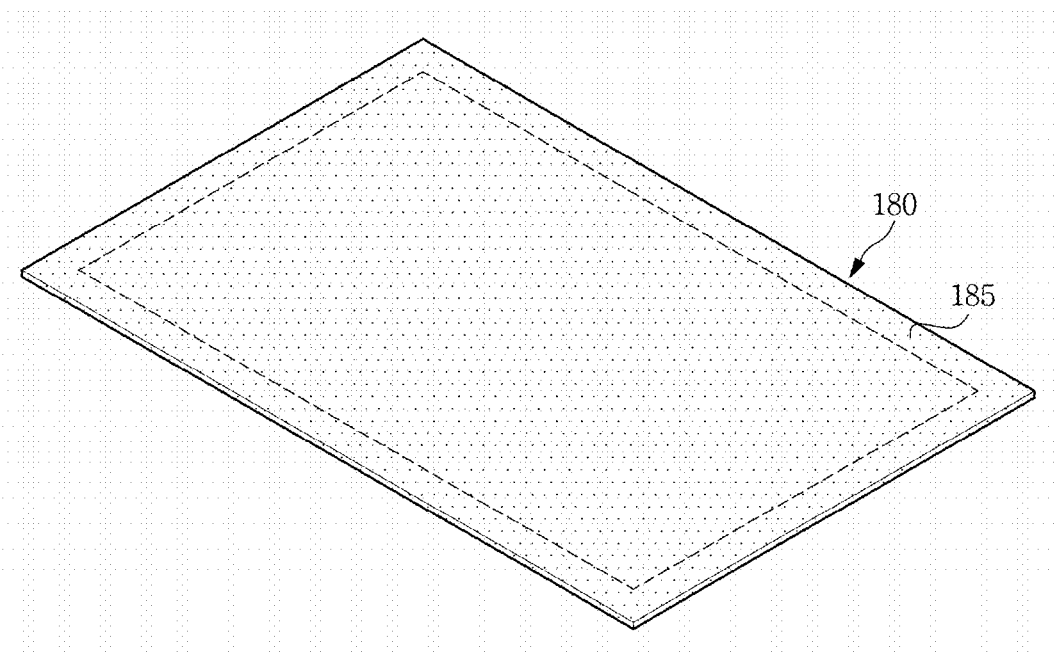
FIGS. 7A, 7B, 7C and 7D are cross-sectional views illustrating a method of manufacturing the display device, according to an exemplary embodiment.

Referring to FIG. 7A, the second frame 180 is formed by processing a metal. The second frame 180 may include at least one material selected from: stainless steel, aluminum (Al), an Al alloy, magnesium (Mg), a Mg alloy, copper (Cu), a Cu alloy, and an EGI.

The second frame 180 of the display device according to an exemplary embodiment may have a quadrangular planar shape having a predetermined thickness, as shown in FIGS. 1 to 4. The second frame 180 may have a thickness in a range of about 0.1 T to about 1.0 T.

In such an embodiment, the second frame 180 of the display device has a quadrangular planar shape, but not being limited thereto. In an alternative embodiment the second frame 180 of the display device may have a side wall portion extending from an edge of the second frame 180 in a vertical direction, as shown in FIGS. 5A and 5B, or may have a quadrangular planar shape having a predetermined curvature as shown in FIGS. 6A and 6B. In another alternative exemplary embodiment, the second frame 180 may have various shapes based on a purpose of use of the display device.

An edge of an upper surface of the second frame 180 corresponds to the bonding portion 185. The bonding portion 185 undergoes a surface processing performed thereon, and the first frame 170 is disposed on the bonding portion 185.

Figure 7B:
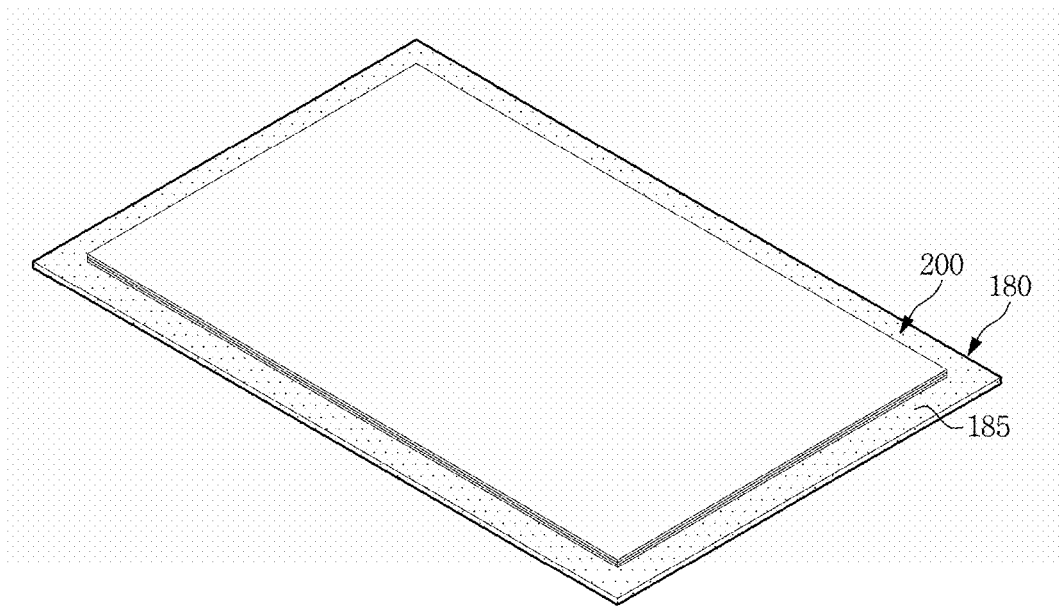

Referring to FIG. 7B, a protection layer 200 is formed on an entire surface of the second frame 180 except the bonding portion 185. The protection layer 200 may include at least one of, for example, silicon oxide ($SiO_x$) and silicon nitride ($SiN_x$). In such an embodiment, the protection layer 200 may have a single layer structure or a multi-layer structure.

Figure 7C:
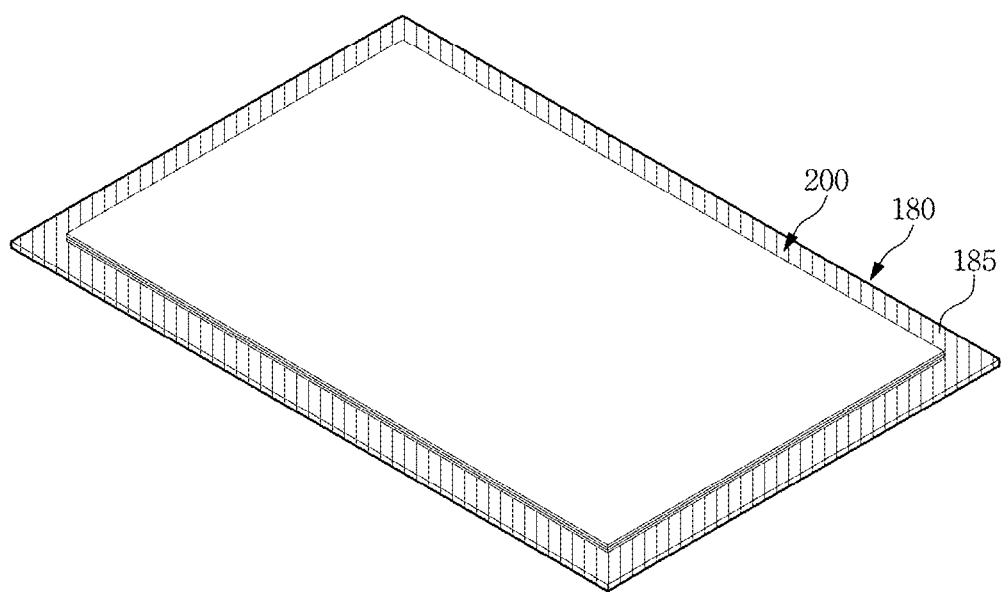

Referring to FIG. 7C, the bonding portion 185 is etched using at least one selected from: a hydrochloric acid aqueous solution in a range of about 20% to about 30%, a sulfuric acid aqueous solution in a range of about 20% to about 30%, and a nitric acid aqueous solution in a range of about 20% to about 30%.

Consequently, a plurality of grooves having a width in a range of about 1 μm to about 30 μm and a depth in a range of about 1 μm to about 10 μm may be formed in the bonding portion 185.

During the etching process of the bonding portion 185 of the second frame 180, a dipping process may be used. The dipping process may be performed at a temperature in a range of about 30 degrees Celsius (° C.) to about 70° C., and during a period of time in a range of about 1 minute to about 5 minutes. Subsequent to the etching process, the protection layer 200 is removed and a washing process is performed.

Figure 7D:
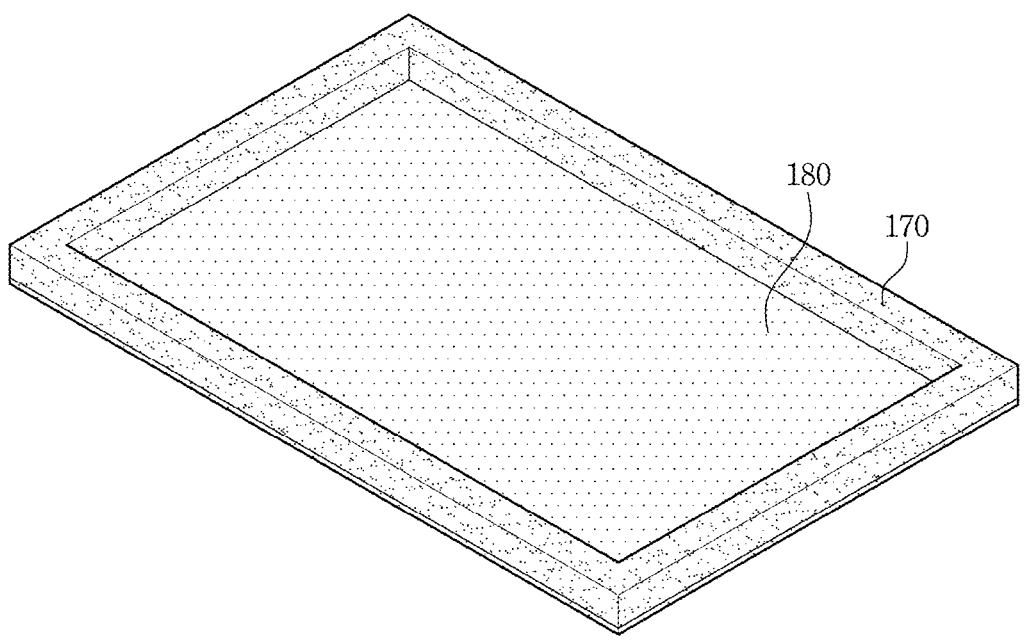

Referring to FIG. 7D, the second frame 180 having the surface-processed bonding portion 185 is inserted into an injection mold, and the first frame 170 is provided on the bonding portion 185 and in the plurality of grooves formed in the bonding portion 185.

The first frame 170 may be formed using one of an insert injection molding process and an outsert injection molding process.

The first frame 170 may include at least one material selected from: an epoxy resin composition; a silicon resin composition; a modified epoxy resin composition such as a silicon-modified epoxy resin; a modified silicon resin composition such as an epoxy-modified silicon resin; a polyimid resin composition; a modified polyimide resin composition; PPA; a PC resin; PPS; an LCP; an ABS resin; a phenol resin; an acrylic resin; and a PBT resin.

As set forth above, according to exemplary embodiments, the plurality of grooves in which a width thereof have a length in micrometers is formed in the bonding portion of the second frame contacting the first frame through an etching process, and may form the first frame through an injection molding process, thereby enhancing a bonding strength between the first frame and the second frame and providing a display device having a narrow bezel.

In such embodiments, the display device may be easily provided in a curved shape, using the second frame in which an additional side wall portion thereof is omitted.

In such embodiments, the display device having a relatively small thickness may be provided by integrally forming the first frame with the second frame.

From the foregoing, it will be appreciated that various embodiments in accordance with the disclosure have been described herein for purposes of illustration, and that various modifications may be made without departing from the scope and spirit of the teachings. Accordingly, the various embodiments disclosed herein are not intended to be limiting of the true scope and spirit of the teachings. Various features of the above described and other embodiments can be mixed and matched in any manner, to produce further embodiments consistent with the invention.

What is claimed is:

1. A display device comprising:
   a display panel which displays an image;
   a first frame which supports a lower edge of the display panel; and
   a second frame which supports the first frame,
   wherein a plurality of grooves is defined in a bonding portion of the second frame contacting the first frame,
   a portion of the first frame is filled in the grooves of the second frame, and
   the grooves have an irregular shape and a width in a range of about 1 micrometer to about 30 micrometers.

2. The display device of claim 1, wherein the second frame comprises a bottom portion contacting the first frame.

3. The display device of claim 2, wherein the second frame further comprises a side wall portion extending from an edge of the bottom portion in a vertical direction.

4. The display device of claim 3, wherein the first frame contacts the bottom portion and the side wall portion.

5. The display device of claim 1, wherein the first frame and the second frame have a bonding strength of about 100 kilogram-forces per square centimeter or more therebetween.

6. The display device of claim 1, wherein the first frame comprises at least one material selected from: an epoxy resin composition; a silicon resin composition; a modified epoxy resin composition; a modified silicon resin composition; a polyimid resin composition; a modified polyimide resin composition; polyphthalamide; a polycarbonate resin; polyphenylene sulfide; a liquid crystal polymer; an acrylonitrile butadiene styrene resin; a phenol resin; an acrylic resin; and a polybutylene terephthalate resin.

7. The display device of claim 1, wherein the second frame comprises at least one material selected from: stainless steel, aluminum (Al), an aluminum alloy, magnesium (Mg), a Mg alloy, copper (Cu), a copper alloy, and an electrolytic galvanized iron.

8. The display device of claim 1, wherein the second frame has a predetermined curvature in a direction.

9. The display device of claim 8, wherein the second frame has a radius of curvature in a range of about 1000 millimeters to about 5000 millimeters.

* * * * *